United States Patent [19]
Yen

[11] Patent Number: 5,861,676
[45] Date of Patent: Jan. 19, 1999

[54] METHOD OF FORMING ROBUST INTERCONNECT AND CONTACT STRUCTURES IN A SEMICONDUCTOR AND/OR INTEGRATED CIRCUIT

[75] Inventor: Ting Yen, Fremont, Calif.

[73] Assignee: Cypress Semiconductor Corp., San Jose, Calif.

[21] Appl. No.: 758,223

[22] Filed: Nov. 27, 1996

[51] Int. Cl.[6] .................................................. H01L 23/52
[52] U.S. Cl. ......................... 257/776; 257/773; 257/905; 438/637; 438/621; 438/618; 438/633
[58] Field of Search ................................ 438/637, 675, 438/700, 634, 621, 618, 633; 257/288, 368, 316, 321, 905, 773, 776

[56] References Cited

U.S. PATENT DOCUMENTS

| | | |
|---|---|---|
| 4,711,701 | 12/1987 | McLevige . |
| 4,789,648 | 12/1988 | Chow et al. . |
| 4,892,835 | 1/1990 | Rabinzohn et al. . |
| 4,933,743 | 6/1990 | Thomas et al. . |
| 5,065,208 | 11/1991 | Shah et al. . |
| 5,093,279 | 3/1992 | Andreshak et al. . |
| 5,166,771 | 11/1992 | Godinho et al. . |
| 5,219,784 | 6/1993 | Solheim . |
| 5,258,096 | 11/1993 | Sandhu et al. . |
| 5,262,354 | 11/1993 | Cote et al. . |
| 5,286,674 | 2/1994 | Roth et al. . |
| 5,302,266 | 4/1994 | Grabarz et al. . |
| 5,312,777 | 5/1994 | Cronin et al. . |
| 5,366,929 | 11/1994 | Cleeves et al. . |
| 5,371,047 | 12/1994 | Greco et al. . |
| 5,385,634 | 1/1995 | Butler et al. . |
| 5,496,771 | 3/1996 | Cronin et al. . |
| 5,541,427 | 7/1996 | Chappell et al. . |
| 5,702,981 | 12/1997 | Maniar et al. . |

OTHER PUBLICATIONS

08/577,751 Dec. 22, 1995 Pending.

Primary Examiner—Caridad Everhart
Attorney, Agent, or Firm—Oblon, Spivak, McClelland, Maier & Neustadt, P.C.

[57] ABSTRACT

A conducting trench in a dielectric layer can function as both (a) a plurality of contacts and (b) an interconnect in a semiconductor device. The conducting trench may be made by depositing a conductor in a trough formed in a dielectric layer of the device.

20 Claims, 4 Drawing Sheets

METHOD OF FORMING ROBUST INTERCONNECT AND CONTACT STRUCTURES IN A SEMICONDUCTOR AND/OR INTEGRATED CIRCUIT

BACKGROUND OF THE INVENTION

1. Field of the Invention

The present invention relates to a method of forming interconnects and contacts between elements in a semiconductor or integrated circuit, as well as a device or integrated circuit having these interconnects and contacts.

2. Discussion of the Background

A variety of methods have been used to make electrical connections between transistors in integrated circuit devices. One method makes use of self-aligned contacts (SAC), or SAC technology, and is illustrated in FIGS. 1a–1c. SAC technology allows contacts to be made to portions of the substrate, typically the source or drain of a transistor element, which can overlap the gate of a transistor, or overlap the edge of diffusion, without making electrical contact with these overlapped areas. FIG. 1a shows gates 12 encapsulated with a cap 14 and spacers 16. Typically, the gate 12 is made of highly doped polysilicon, and the caps 14 and spacers 16 are made from an insulator, such as silicon oxide. These are present on the substrate 10, and these elements are isolated from other regions of the semiconductor substrate by isolation region 18, typically made as an oxidized portion of the substrate. The encapsulated gate is typically made by depositing a layer of polysilicon, and depositing a layer of oxide on the polysilicon layer. This is then followed by a mask and etch of the oxide and polysilicon together. The spacers 16 may be formed by (a) an anisotropic etch of the oxide deposited on the gate or by (b) spacer oxide deposition, followed by spacer etch.

FIG. 1b shows the next step in formation of the self-aligned contacts. A SAC etch stop layer 20, typically about 700 Å of silicon nitride, is deposited on the substrate 10, and on the gates 12, the caps 14 and spacers 16. A thick dielectric layer 24 is applied over the etch stop layer 20. The dielectric layer is typically made of doped silicon dioxide (e.g., spin-on glass, BPSG, reflow). The dielectric layer 24 is then planarized, for example using chemical-mechanical polishing (CMP).

FIG. 1c shows the final SAC structure. Vias are formed in the dielectric layer 24 by a series of masking and etching steps. The etching proceeds quickly through the dielectric 24 until it reaches the etch stop layer 20, where the etching rate is greatly reduced. Thus, if the masking and etching is somewhat misaligned from the substrate contact regions 22 (i.e., source or drain), SAC technology prevents misalignment of the via, because the etch stop layer greatly slows the vertical etching process, preventing the via from penetrating through caps 14 to the gates 12. The etch chemistry is then changed to selectively remove the exposed portions of the etch stop layer 20. Once the vias are formed, they are filled with a conductor, such as tungsten, to form metal contacts 32. After planarizing the metal contact 32 to the surface of the dielectric layer 24, the contacts can be connected to each other and/or to other circuit components with surface metal interconnects 30. A distinct advantage of SAC technology is that the contacts generally cannot be misaligned, allowing various circuit components to be placed very close together.

A different method has been used for making electrical contact between two closely spaced regions or elements of a semiconductor circuit (i.e., local interconnects) illustrated in FIGS. 2a–2c. FIG. 2a, which is identical to FIG. 1a, or a side or edge-on view of a device, illustrating gates 12, which are encapsulated with caps 14 and spacers 16, on substrate 10. Also present is isolation region 18. A dielectric layer 24 is then added, and planarized, as illustrated in FIG. 2b. When forming a local interconnect, the dielectric layer 24 has a thickness at this stage which corresponds to the final thickness of the local interconnect, typically 2000 Å.

FIG. 2c shows the final structure including the local interconnect 34. The local interconnect 34 is prepared by masking and etching a trough (generally rectangularly-shaped when viewed from the top) in the dielectric 24 without etching through the caps 14 over the gates 12. The dielectric layer 24 is etched through to the substrate contact regions 22. The trough is then filled with a conductor, such as tungsten, and planarized to the level of the dielectric 24, thereby forming an electrical connection between the substrate regions 22.

The process of forming a trough in a dielectric layer and then filling the trough with a conductor is also known as a metal damascene process. Typically, the normal damascene process is used only for local interconnects, as the interconnects tend to be shallow, and therefore have a high resistance. The local interconnects are only suitable for providing an electrical connection over short distances, because of their high resistance.

SAC technology is typically used to form metal contacts from substrate contact regions, through a dielectric layer, to form electrical contacts with the surface metal interconnects between circuit elements. SAC technology, together with the surface metal interconnects, allows long range contacts to be formed between substrate contact regions, and hence a variety of circuit elements, across the semiconductor device.

Metal interconnects running along the surface of the dielectric layer are useful for long range contacts, regardless of whether SAC technology or a metal damascene process is used. These metal contacts are separately deposited, masked and etched, and planarized, requiring additional steps.

The present invention combines aspects of both damascene and SAC technologies, providing robust, low resistance connections and contacts between substrate contact regions across a semiconductor device, removing or reducing the need for metal interconnects on the dielectric layer.

SUMMARY OF THE INVENTION

Accordingly, one embodiment of the invention electrically connects the contacts to the substrate and the interconnects between these contacts using conducting trenches.

Another embodiment of the invention provides low resistance, robust contacts between transistor elements across a semiconductor device.

Another embodiment of the invention provides a novel damascene approach, compatible with SAC technology, of forming interconnects in a semiconductor device.

Another embodiment of the invention provides a process for preparing conducting trenches, forming both contacts and interconnects during the same step.

Another embodiment of the invention provides a semiconductor device comprising the novel conducting trenches.

These embodiments are made possible by a method of forming an interconnect and/or contact structure in a semiconductor or integrated circuit, comprising forming a trough in a structure comprising a semiconductor substrate, gates on said substrate, an etch stop layer on at least a first portion of said substrate, and a dielectric layer on at least a second portion of said substrate, wherein portions of said etch stop layer and a plurality of substrate regions are exposed in said trough; and depositing a conductor in said trough, thereby forming a conducting trench; wherein said conducting trench electrically connects at least two of said substrate regions, and said conducting trench contacts portions of said etch stop layer. This method may also comprise etching a pattern through said etch stop layer, thereby exposing a plurality of substrate regions.

These embodiments are also made possible by a semiconductor device, comprising (i) a substrate, (ii) gates on said substrate, (iii) an etch stop layer on a portion of said substrate, (iv) a dielectric layer on a portion of said substrate, and (v) a conducting trench in said dielectric layer, electrically connecting at least two substrate regions and contacting portions of said etch stop layer.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION OF THE INVENTION

Figure 3A:
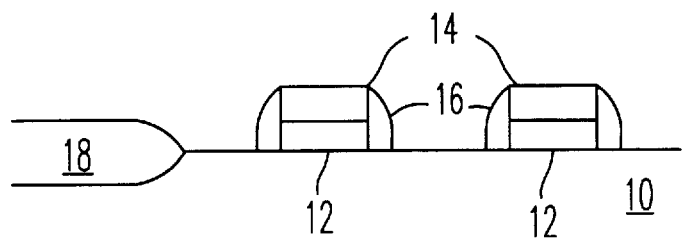
FIGS. 3a–3f illustrate a series of successive edge-on views of the novel conducting trenches of the present invention.
Figure 3B:
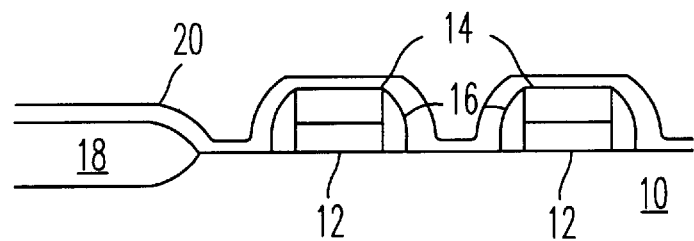
Figure 3C:
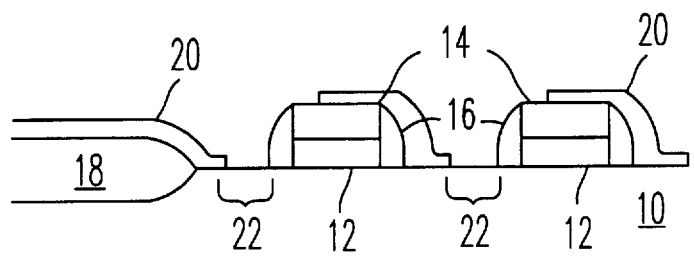
Figure 3D:
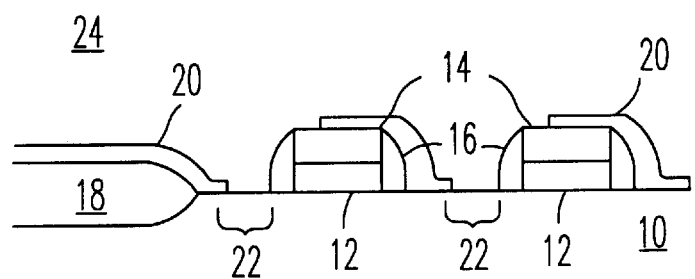
Figure 3E:
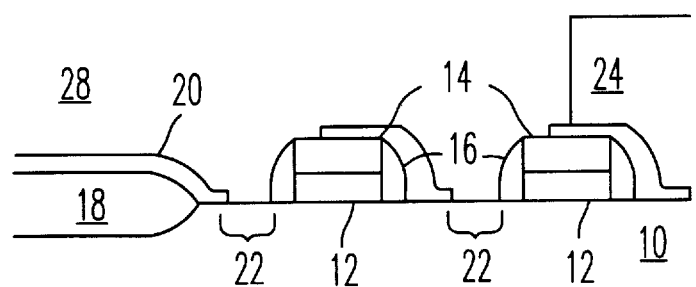
Figure 3F:
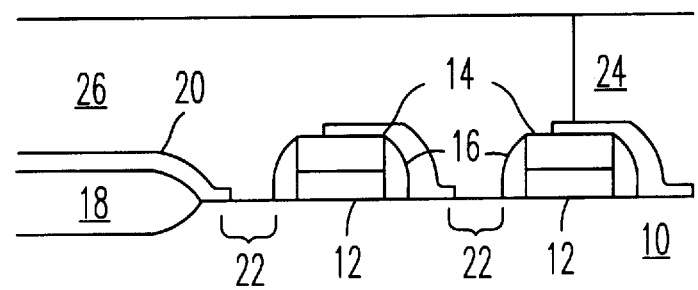

A unified interconnect and contact structure, or conducting trench, according to the present invention is illustrated in FIG. 3f. A conducting trench 26 makes contact with substrate contact regions 22, and may travel across substrate 10 and over gate structures 12, electrically connecting a plurality of substrate contact regions. The etch stop layer 20 electrically insulates portions of the substrate from the conducting trench 26. The etch stop layer 20, along with the caps 14 and the spacers 16, electrically insulate the gates 12 from the conducting trench 26.

The substrate contact regions are portions of the substrate that may be electrically connected to other substrate contact regions, or circuit elements, by the conducting trench. Typically, the substrate contact regions comprise the source and/or drain of a transistor. At least two substrate contact regions, preferably at least three substrate contact regions, and more preferably at least five substrate contact regions, are electrically connected by each conducting trench. Other circuit elements present on the surface of the substrate may also be electrically connected with the conducting trench, for example, one or more transistor, and independently, one or more gates or resistors. The conducting trenches are robust, and have relatively low resistance, and are therefore suitable for connecting multiple substrate contact regions, even if they are not close together (e.g., proximate or adjacent to each other). The conducting trenches may connect substrate contact regions or circuit elements which are separated by a distance of 5 $\mu$m or more, 20 $\mu$m or more, or even 200 $\mu$m or more. The conducting trenches may be composed of any conductor, especially those which have previously been used as metal interconnects, such as materials with a specific resistivity of $10^{-2}$ $\Omega$ cm. Preferably, the conducting trenches comprise tungsten, aluminum, copper or alloys thereof (e.g., titanium-tungsten alloy or aluminum-copper alloy).

FIGS. 3a–3f illustrate edge-on views of intermediate structures in a semiconductor device made by a process including the present process for forming the conducting trenches.

FIG. 3a illustrates gates 12, encapsulated with caps 14 lo and spacers 16, on a substrate 10. Isolation region 18 is also included in the figure. One way of forming these structures is to prepare the substrate, for example by localized oxidation of silicon (LOCOS), then to form a gate layer, for example from polysilicon, and then form the cap layer from any etch stop dielectric material having a significantly lower etch rate (for a silicon etch system) relative to a subsequently deposited dielectric material 24, for example, silicon nitride. Conventional masking and etching steps known to those of ordinary skill in the art may then be used to form the gate and the cap together, followed by formation of the spacers. The spacers may also be made of any dielectric material, such as silicon dioxide, or an etch stop dielectric, such as silicon nitride, by conventional methods.

FIG. 3b illustrates the formation of the etch stop layer 20. The etch stop layer is deposited over the substrate 10 and over the gates 12, caps 14 and spacers 16. The etch stop layer may be 10–10,000 Å thick, preferably 100–5,000 Å, more preferably 300–2,000 Å thick. The etch stop layer acts as a barrier to the etch process used to etch the subsequently deposited dielectric layer, and preferably comprises silicon nitride. In the present invention, the caps and spacers may also serve this function.

Figure 1A:
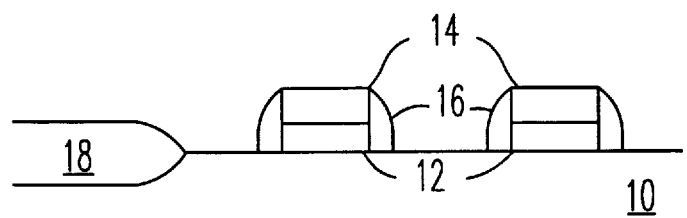
FIGS. 1a–1c illustrate a series of successive edge-on views of the formation of self-aligned contacts.
Figure 1B:
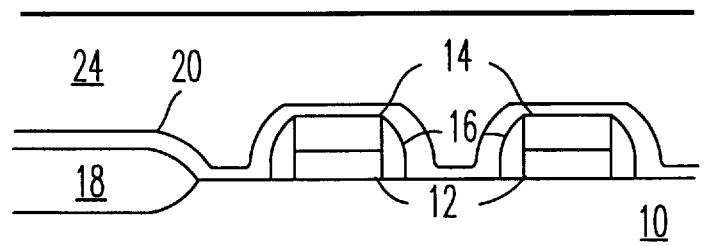
Figure 1C:
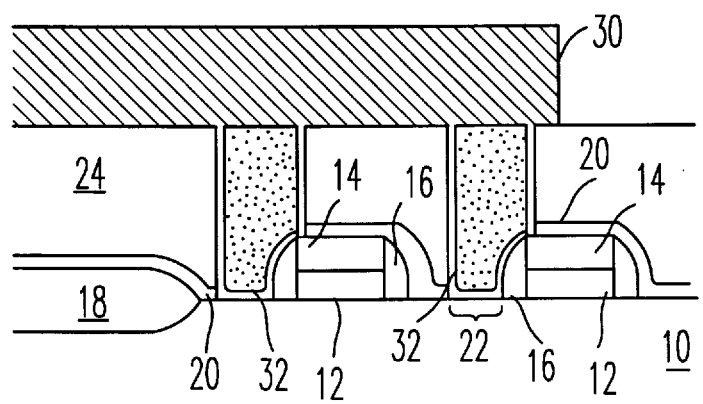
Figure 2A:
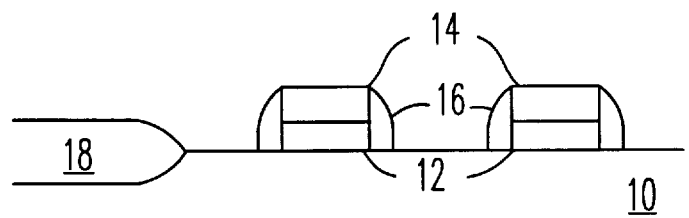
FIGS. 2a–2c illustrate a series of successive edge-on views of damascene formation of local interconnects.
Figure 2B:
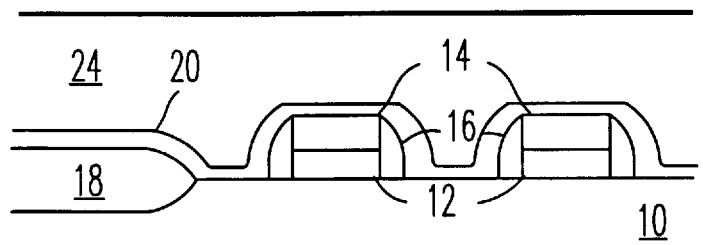
Figure 2C:
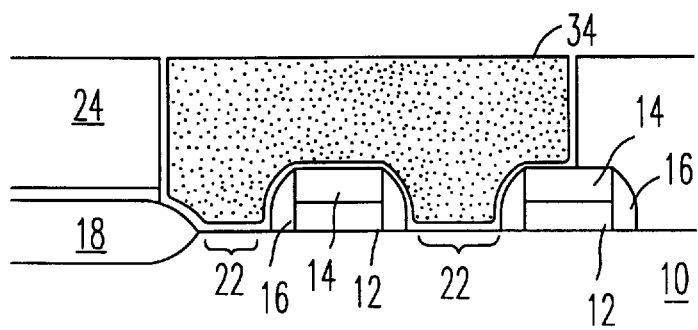

The etch stop layer may then be masked and etched to expose substrate contact regions 22, as illustrated in FIG. 3c. The etch stop layer may be thin relative to gates 12 and/or caps 14, and it may be selectively etched (i.e., at a significantly faster rate) relative to the encapsulation materials (e.g., caps 14 and spacers 16), which encapsulate the gate 12. Etching is preferably conducted for a period of time sufficient to etch through the etch stop dielectric to expose a region of a semiconductor substrate 22, because the cap 14 and spacer 16 may be made of the same material as the etch stop dielectric). This step is not used during conventional damascene fabrication, nor with conventional SAC technology, because in conventional damascene fabrication and SAC technology, the etch stop layer, if present, is etched only after formation and planarization of an overlaying dielectric layer, such as layer 24 in FIGS. 1–2.

After the substrate contact regions 22 have been exposed by etching the etch stop layer 20, a dielectric layer 24 is applied over the substrate, covering the etch stop layer 20, exposed portions of the caps 14 and spacers 16, as well as the exposed substrate contact regions 22, as illustrated in FIG. 3d. The dielectric layer may comprise one or more layers of a dielectric material, such as silicon dioxide, borosiloxide glass (BSG), phosphosilicate glass and/or borophosphosilicate glass (BPSG). The dielectric material may then be subjected to a reflowing step for densification, and then the dielectric material may be planarized, for example by CMP. The dielectric layer may be 0.1–10 $\mu$m, preferably 0.3–5 $\mu$m, more preferably 0.5–2.0 $\mu$m thick.

A trough 28 is then formed in the dielectric layer 24 by conventional masking and etching, as illustrated in FIG. 3e. However, a selective etching process is chosen which etches through the dielectric layer 24 without significantly etching the etch stop layer 20, the caps 14 or spacers 16, thus exposing substrate contact regions 22. The dielectric layer 24 may be highly doped (for example, with phosphorous or boron) to enhance its selective etching over other structures, such as the caps 14, spacers 16 and etch stop layer 20.

Finally, a conducting trench is formed, as illustrated in FIG. 3f. The trough 28 formed in the dielectric layer 24 is filled with a conducting material. For example, an initial deposit of Ti/TiN followed by selective deposition of tungsten can be used to fill the trough, thereby forming a conducting trench. However, other conductive materials, such as aluminum and/or copper, may be deposited in addition to or instead of tungsten, in the trench. The conducting trench 26 may then be planarized to the top of the dielectric layer 24 by conventional method known to those of ordinary skill in the art, such as by CMP.

A conducting trench 26 has a much larger depth than a local interconnect resulting from conventional damascene processing. The etch stop layer prevents the interconnect from making electrical contact with any gate over which the interconnect passes. The ratio of the depth of the conducting trench over the substrate contact region (i.e. the distance from the top surface of the conducting trench 26 to the top surface of the substrate 10) to the depth of the conducting trench over the gate (i.e. the depth from the top of the interconnect 26 to the top of the etch stop layer 20) is preferably at least 1:1, more preferably 1:1–1:20, even more preferably at least 1:2, such as 3:1–1:10, as well as subdivisions therebetween.

The present conducting trench is different from interconnects typically used with SAC formation. Rather than having metal contacts which pass perpendicular to the plane of the substrate through the dielectric layer to the surface, and which are electrically connected together by metal interconnects that travel across the surface of the dielectric, the conducting trenches of the present invention pass parallel to the plane of the substrate through the dielectric layer, connecting a plurality of substrate contact regions. Each substrate contact region may be associated with a separate transistor, and at least 2, preferably at least 3, more preferably at least 5, even more preferably at least 10, separate transistors are electrically connected by the interconnects of the present invention. The use of an etch stop layer as the primary insulator between the conducting trenches and those regions of the substrate, or gates, which are not to be electrically connected with the conducting trenches, allows the conducting trenches to pass over at least one gate, preferably a plurality of gates, without making electrical contact. The thinnest portion of the conducting trenches which passes over the gate is separated from the gate by the etch stop layer and a cap. The ratio of (a) the depth of the conducting trench (at regions other than contact regions) to (b) the depth of the etch stop layer and the cap (which form the insulation over the gate) is preferably at least 1:1, such as 1:1–1:100, more preferably at least 1:2, even more preferably 1:10–1:50. The conducting trench has a depth at its thinnest portion, of 0.1–10.0 $\mu$m, preferably 0.3–5.0 $\mu$m, more preferably 0.5–2.0 $\mu$m.

The individual processing steps for use in the present invention are well known to those of ordinary skill in the art, and are also described in *Encyclopedia of Chemical Technology*, Kirk-Othmer, Volume 14, pp. 677–709 (1995), and *Semiconductor Device Fundamentals*, Robert F. Pierret, Addison-Wesley, 1996. Conventional chemical-mechanical polishing is described in U.S. Pat. Nos. 4,789,648, 4,954,142 and 5,262,354.

The substrate may typically be a semiconductor material conventionally known by those of ordinary skill in the art. Examples include silicon, gallium arsenide, germanium, gallium nitride, aluminum phosphide, and alloys such as $Si_{1-x}Ge_x$ and $Al_xGa_{1-x}AS$, where $0 \leq x \leq 1$. Many others are known, such as those listed in *Semiconductor Device Fundamentals*, on page 4, Table 1.1 (Robert F. Pierret, Addison-Wesley, 1996). Furthermore, the substrate often may have a top layer of an oxide, such as silicon oxide, which can act to protect the substrate, and/or as the gate oxide of a transistor. Usually, the source and drain regions of the transistor are formed in the substrate.

The gate and gate layer are typically made from highly doped polysilicon. The resistivity of silicon can be controlled over a wide range by varying the concentration of impurities such as phosphorous, boron and/or arsenic, as described in *Microchip Fabrication*, Peter Van Zant, pp 21–42 (McGraw-Hill, 1990). one of ordinary skill in the art is familiar with the amounts and identities of dopants used to provide the polysilicon of the gate with its desired properties and function(s). Other conductors conventionally known to those of ordinary skill in the art, which have a resistivity on the same order as that of the highly doped polysilicon, can also be used for the gate or gate layer. Examples include $WSi_x$, Al, W, Ti, Zr, Mo, and alloys thereof e.g. TiW alloy, or a silicide such as $CoSi_2$, $HfSi_2$, $MoSi_2$, $NiSi_2$, $Pd_2Si$, PtSi, $TaSi_2$, $TiSi_2$, $WSi_2$, $ZrSi_2$ and $CrSi_2$.

In addition, first level interconnections (not shown), which may be located in the periphery of a semiconductor device, can also be formed from the same layer as the gate, by conventional methods.

A dielectric layer, caps, spacers and an etch stop layer may be made from a dielectric material conventionally known to those of ordinary skill in the art. Examples include conventional oxides, nitrides, oxynitrides, and other dielectrics, such as borophosphosilicate glass (BPSG), borosilicate glass (BSG), phosphosilicate glass, spin-on glass (SOG), silicon oxide, P-doped silicon oxide (P-glass), and silicon nitride. The dielectric layer must be made from a material which is different from the etch stop layer, the caps and spacers. The etch stop layer, the caps and the spacers may be made from the same or different materials.

The dielectric layer may be deposited by conventional methods known to those of ordinary skill in the art, such as by spin-on methods, sintering (which may further include sol-gel oxide formation), chemical vapor deposition, etc. A glass layer deposited by a chemical vapor deposition technique may be subject to a glass reflow step (e.g., by heating) to smooth, densify and further improve the contact between the protection layer and the substrate.

The dielectric layer is selected from a material that can be etched more quickly than the etch stop layer. If the dielectric layer is made from a glass, such as borophosphosilicate glass (BPSG), borosilicate glass (BSG), phosphosilicate glass, spin-on glass (SOG), or P-doped silicon oxide (P-glass), it may be doped sufficiently in order to enhance the selectivity of the etch for etching the glass instead of the etch stop layer. Preferably the dielectric layer is made of a glass, while the etch stop layer, the caps and the spacers are made from silicon nitride. Preferably, the etch selectivity (i.e., the ratio of (a) the rate of dielectric etching to (b) the rate of etch stop material etching) is at least 2:1, preferably at least 3:1, more preferably at least 5:1 and even more preferably at least 10:1.

The conducting trenches may be made from a conducting material. Examples of suitable conducting materials include metals such as aluminum, titanium, copper, zirconium, chromium, molybdenum, tungsten or alloys thereof (e.g., TiW). When the conductor is aluminum, titanium or tungsten, the conductor may be alloyed with silicon (e.g., by conventional annealing) to reduce dissolution of source and drain silicon into the conductor. Preferably the conducting trenches comprise tungsten, and are formed by depositing a seed layer of Ti and/or TiN onto the underlying material etching the seed layer by removing it from areas outside the trench, then selectively depositing tungsten therein, for example using $WF_6$.

The conducting trench of the present invention may be incorporated into a semiconductor device such as an integrated circuit, for example a memory cell such as an SRAM, a DRAM, an EPROM, an $E^2PROM$ etc.; a programmable logic device; a data communications device; etc.

Etching of deposited films may be conducted by conventional methods known to those of ordinary skill in the art. The specific etching method and materials depend on the material being removed, the resist material and the compatibility of the etching material with the existing structure. Selection of suitable etching materials, resist materials and etching conditions is within the level of skill of those of ordinary skill in the art.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A method of forming an interconnect and/or contact structure in a semiconductor or integrated circuit, comprising:

forming a trough in a structure comprising a semiconductor substrate, gates on said substrate, an etch stop layer on at least a first portion of said substrate, and a dielectric layer on at least a second portion of said substrate, wherein portions of said etch stop layer and a plurality of substrate regions are exposed in said trough; and depositing a conductor in said trough, thereby forming a conducting trench;

wherein said conducting trench electrically connects at least two of said substrate regions, and said conducting trench contacts portions of said etch stop layer.

2. The method of claim 1, wherein
   said substrate, said gates, said etch stop layer, and said dielectric layer, are prepared by a process comprising:
   etching a trough through said dielectric layer, thereby exposing said portions of said etch stop layer and said plurality of substrate regions.

3. The method of claim 2, wherein said process further comprises, prior to said etching of said trough:
   depositing said etch stop layer, followed by
   exposing said plurality of substrate regions by etching said etch stop layer.

4. The method of claim 2, wherein said process further comprises, prior to said etching of said trough:
   exposing said plurality of substrate regions by etching said etch stop layer, followed by
   depositing said dielectric layer.

5. The method of claim 1, wherein said dielectric layer comprises a glass, and
   said etch stop layer comprises a nitride.

6. The method of claim 1, wherein said gates are encapsulated with caps and spacers comprising a nitride.

7. The method of claim 6, wherein said conducting trench comprises tungsten, a tungsten alloy, aluminum or an aluminum alloy.

8. The method of claim 1, wherein said conducting trench electrically connects at least three of said substrate regions.

9. The method of claim 1, wherein said conducting trench has a minimum depth of 0.3–5 $\mu$m between two of said substrate regions electrically connected by said conducting trench.

10. A method of forming an interconnect and/or contact structure in a semiconductor or integrated circuit, comprising:
    etching a pattern through an etch stop layer on at least a first portion of a substrate, thereby exposing a plurality of substrate regions; followed by
    depositing a dielectric layer on said substrate;
    wherein gates are on said substrate, and said etch stop layer is on a portion of said gates.

11. The method of claim 10, further comprising etching a trough through a dielectric layer on at least a second portion of said substrate, thereby exposing portions of said etch stop layer and said plurality of substrate regions.

12. The method of claim 11, further comprising deposition a conductor in said trough, thereby forming a conducting trench;
    wherein said conducting trench electrically connects at least two of said substrate regions, and
    said conducting trench contacts portions of said etch stop layer.

13. The method of claim 12, wherein said conducting trench has a minimum depth of 0.3–5 $\mu$m between two of said substrate regions electrically connected by said conducting trench.

14. The method of claim 1, wherein said dielectric layer comprises a glass,
    said etch stop layer comprises a nitride, and
    said conducting trench comprises tungsten, a tungsten alloy, aluminum or an aluminum alloy.

15. A semiconductor device, comprising:
    (i) a substrate,
    (ii) gates on said substrate,
    (iii) an etch stop layer on at least a first portion of said substrate,
    (iv) a dielectric layer on at least a second portion of said substrate, and
    (v) a conducting trench in said dielectric layer, electrically connecting at least two substrate regions and contacting portions of said etch stop layer.

16. The semiconductor device of claim 15, wherein said conducting trench electrically connects at least three substrate regions.

17. The semiconductor device of claim 15, wherein a ratio of (a) the depth of said conducting trench over one of said substrate regions to (b) the depth of said conducting trench over one of said gates, is 1:1–1:20.

18. The semiconductor device of claim 15, wherein a ratio of (a) the depth of said conducting trench over said gate to (b) the depth of insulation between said conducting trench and said gate is 1:1–1:100.

19. The semiconductor device of claim 15, wherein said dielectric layer comprises a glass,
    said etch stop layer comprises a nitride, and
    said conducting trench comprises tungsten, a tungsten alloy, aluminum or an aluminum alloy.

20. A product produced by the method of claim 1.

* * * * *